United States Patent
Lin et al.

(10) Patent No.: US 9,449,954 B2
(45) Date of Patent: Sep. 20, 2016

(54) LED WITH IC INTEGRATED LIGHTING MODULE

(71) Applicant: TSMC Solid State Lighting Ltd., Hsinchu (TW)

(72) Inventors: Chih-Chia Lin, New Taipei (TW); Hsing-Kuo Hsia, Jhubei (TW); Ching-Hui Chen, Hsinchu (TW); Jacob C. Tarn, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 123 days.

(21) Appl. No.: 13/955,353

(22) Filed: Jul. 31, 2013

(65) Prior Publication Data

US 2014/0264410 A1  Sep. 18, 2014

Related U.S. Application Data

(60) Provisional application No. 61/783,610, filed on Mar. 14, 2013.

(51) Int. Cl.
*H01L 33/00* (2010.01)
*H01L 25/16* (2006.01)
*H05K 1/18* (2006.01)

(52) U.S. Cl.
CPC ............. *H01L 25/167* (2013.01); *H05K 1/181* (2013.01); *H01L 2224/16225* (2013.01); *H01L 2224/48091* (2013.01); *H01L 2224/73265* (2013.01); *H05K 2201/10106* (2013.01); *H05K 2201/10545* (2013.01); *H05K 2203/1316* (2013.01); *H05K 2203/1327* (2013.01); *Y02P 70/611* (2015.11)

(58) Field of Classification Search
CPC ... H01L 33/0004–33/648; H01L 2224/16225; H01L 2224/73265; H01L 2224/48091; H01L 25/167; H01L 2924/00014; H05K 2203/1316; H05K 2203/1327

See application file for complete search history.

(56) References Cited

U.S. PATENT DOCUMENTS

| | | | | |
|---|---|---|---|---|
| 5,647,034 A | * | 7/1997 | Matsuda et al. | 385/16 |
| 6,633,134 B1 | * | 10/2003 | Kondo et al. | 315/169.3 |
| 2012/0205697 A1 | * | 8/2012 | Kim et al. | 257/98 |
| 2012/0248473 A1 | * | 10/2012 | Kuo | 257/89 |
| 2013/0026509 A1 | * | 1/2013 | Tohyama | F21K 9/1355 257/88 |

* cited by examiner

*Primary Examiner* — Cuong B Nguyen
(74) *Attorney, Agent, or Firm* — Muncy, Geissler, Olds & Lowe, P.C.

(57) ABSTRACT

The present disclosure involves a method of packaging light-emitting diodes (LEDs). A carrier having a first side and a second opposite the first side is provided. The carrier includes a plurality of conductive interconnect elements. An integrated circuit (IC) die is bonded to the first side of the carrier. A packaging material having light-reflective properties is molded over the first and second sides of the carrier such that the IC die is sealed by the packaging material. A portion of the packaging material is molded into a reflective cap structure. A light-emitting diode (LED) is bonded to the second side of the carrier. Sidewalls of the reflective cap structure circumferentially surround the LED. The LED and the IC die are electrically coupled together through the conductive interconnect elements in the carrier. A lens is then formed over the LED.

20 Claims, 13 Drawing Sheets

LED WITH IC INTEGRATED LIGHTING MODULE

PRIORITY DATA

This application is a utility application of U.S. Provisional Patent Application No. 61/783,610, filed on Mar. 14, 2013, entitled "Flip Chip LED with IC Integrated Lighting Module," the contents of which are hereby incorporated by reference in their entirety.

TECHNICAL FIELD

The present disclosure relates generally to light-emitting devices, and more particularly, to the packaging of light-emitting diode (LED) and integrated circuit (IC) devices.

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

Conventionally, LED lighting modules adopt LED emitters and IC devices to be assembled on the same board, such as a printed circuit board (PCB). However, these LED emitters and the IC devices are packaged separately by different packaging processes, which adds more complexity to packaging, consumes more space, and increases costs.

Therefore, although existing methods of packaging LEDs have been generally adequate for their intended purposes, they have not been entirely satisfactory in every aspect. A simpler and more efficient way of packaging LEDs continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

DETAILED DESCRIPTION

Figure 1:
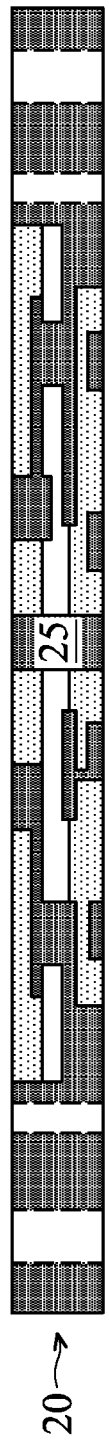
FIGS. 1-10 are diagrammatic fragmentary cross-sectional side views showing a packaging process according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

Traditionally, LED-based light modules have assembled LED emitters and IC devices (e.g., IC devices that control LED operations) on the same board, such as a printed circuit board (PCB). However, these LED emitters and the IC devices are independently packaged via their own packaging processes. As a result, the overall LED light module may be complex, may occupy more space, and may be more expensive.

According to various aspects of the present disclosure, described below is a method and apparatus of packaging LEDs and IC devices together.

FIGS. 1-10 are simplified diagrammatic cross-sectional side views of an LED lighting module 20 at various stages of packaging according to some embodiments of the present disclosure. Referring to FIG. 1, a carrier 20 is provided. The carrier 20 may also contain active circuitry and may be used to establish interconnections. The carrier 20 may also contain thermally conductive members such as through-silicon-vias (TSVs) for dissipating heat. As such, the carrier 20 provides certain electrical routing/interconnection and thermal dissipation functions for devices bonded to the carrier 20. These devices that can be bonded to the carrier 20 include LEDs or ICs. In some embodiments, the carrier 20 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In other embodiments, the carrier 20 may include other suitable devices with electrical and thermal capabilities, for example other types of PCBs, ceramic substrates, copper substrates, silicon substrates, aluminum substrates, stainless steel lead frames.

Figure 2:
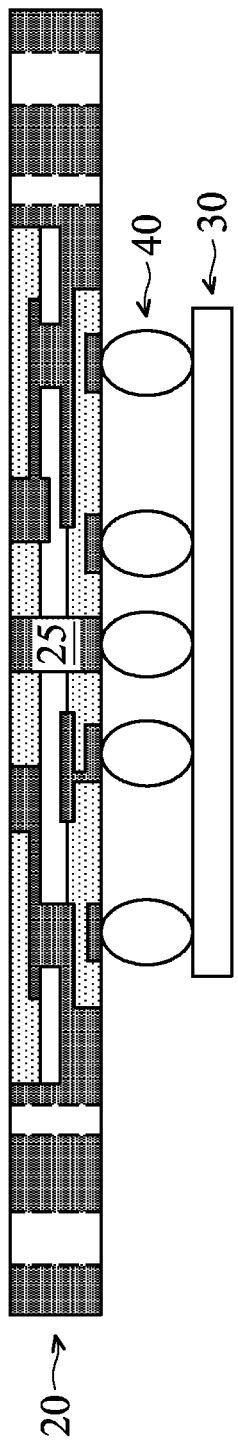

Referring now to FIG. 2, an Integrated Circuit (IC) device 30 is bonded to the carrier 20. In some embodiments, the IC device 30 include an unpackaged IC die or IC chip. In other embodiments, the IC device 30 includes an unpackaged IC matrix. In yet other embodiments, the IC device includes a packaged IC die or IC chip. The IC device 30 contains electrical circuitry that controls the various operational aspects of an LED (discussed below). For example, the IC device 30 may include a power IC, such as a power manager IC for the power source of a lighting module. One type of power ICs are power converter ICs, which may convert AC power to DC power, DC power to AC power, one AC power to a different AC power, or one DC power to a different DC power. Another type of power ICs are linear integrated circuit ICs, such as linear regulator ICs. Yet another type of power ICs are power transistors, such as rectifiers and power diodes, application specifici integrated circuits (ASICs), or application specific standard products (ASSPs). As another example, the IC device 30 may include a microcontroller IC. A microcontroller IC may include a lighting signal control IC, such as a Digitally Addressable Lighting Interface (DALI) unit. As yet another example, the IC device 30 may be a wireless data control IC: such as a Wi-Fi IC, a Bluetooth IC, an RF2.4G IC, or a ZiBee IC. As yet a further example, the IC device 30 may be a network data control IC. The network may be a LAN network, a WAN network, an Internet network, an Intranet network, or a MCU network. As yet an additional example, the IC device 30 may be a sensor IC, for example a temperature sensor IC, a color sensor IC, an image sensor IC, or an optical sensor IC. Furthermore, although only one IC device 30 is shown in FIG. 2, a plurality of IC devices may be bonded to the carrier in other embodiments.

Returning to FIG. 2, the IC device 30 is bonded to the carrier 20 using one or more solder bumps 40 (or solder balls) in a soldering process. Each of the sold bumps 40 may be thermally and electrically coupled to a conductive element in the carrier 20. In other embodiments, different bonding processes may be employed to bond the IC device 30 to the carrier 20, for example an eutectic bonding process may be used.

Figure 3:
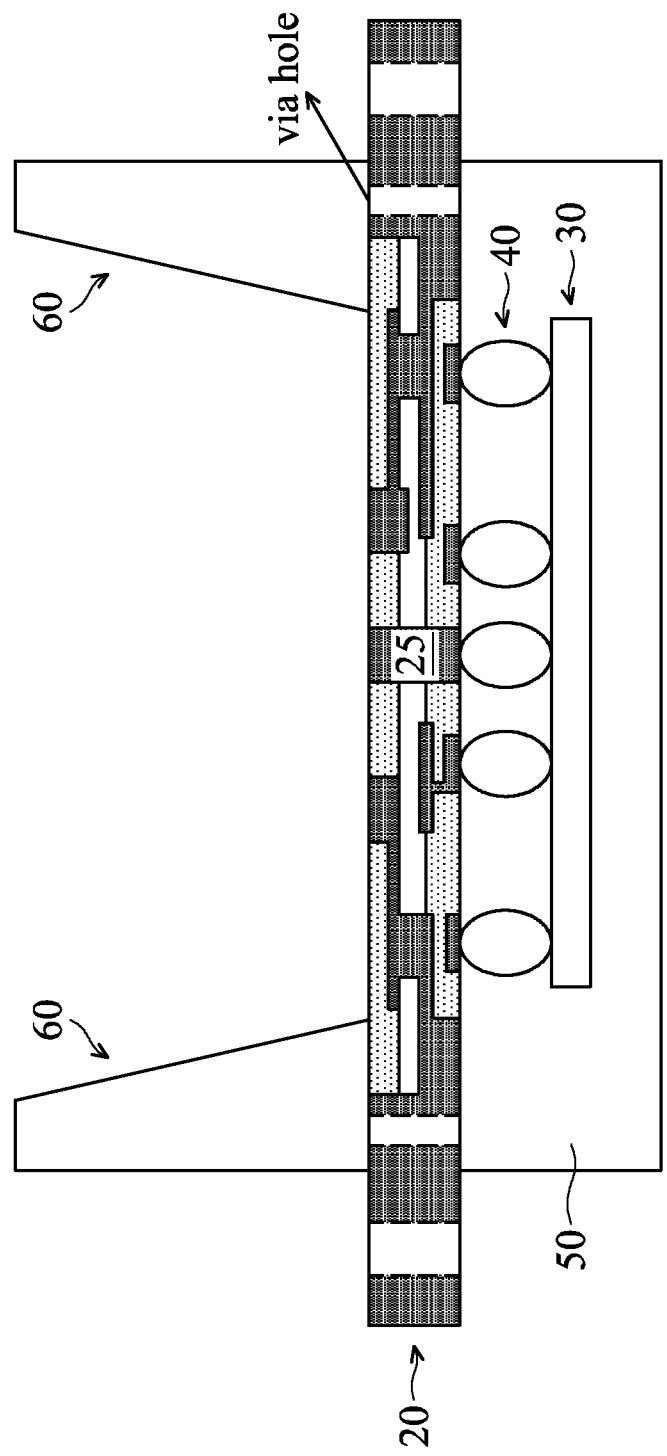

Referring now to FIG. 3, the IC device 30 is packaged by a packaging material 50 in a suitable process, for example a molding process. The IC device 30 is enclosed or sealed by the packaging material 50. The packaging material 50 may include epoxy, silicone, or polyamide in various embodiments. The packaging material 50 protects the IC device 30 from dust, moisture, or other contaminants. In some embodiments, the packaging material 50 has light-reflective properties. According to various aspects of the present disclosure, a part of the packaging material 50 (e.g., the portion above the carrier 20) is also molded into a reflective cap structure 60. The reflective cap structure 60 is configured to reflect radiation (such as light emitted from an LED).

Figure 4:
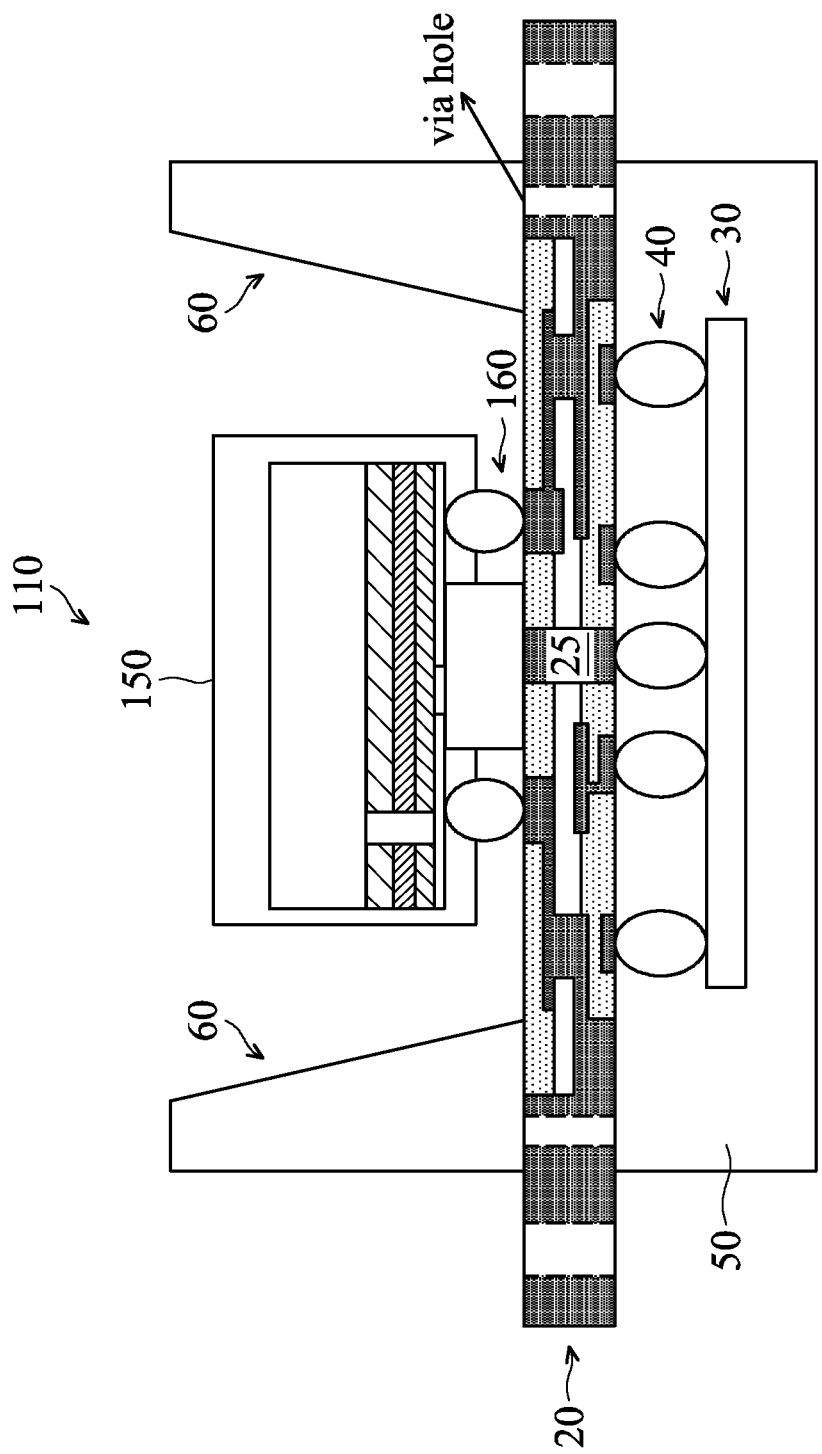

Referring now to FIG. 4, a semiconductor photonic device 110 is bonded to the carrier 20 within the reflective cap structure 60. In the illustrated embodiments, the semiconductor photonic device 110 is an LED die and may hereinafter be referred to as such. Of course, the semiconductor photonic device 110 may also include an LED die matrix in other embodiments. In some embodiments, the LED die 110 is bonded through a conductive material such as tin solder or gold tin eutectics. The LED die 110 serves as a light source for a lighting module. The LED die 110 may be configured to emit red light, green light, blue light, or white light. In the illustrated embodiment, the LED die 110 is flip-chip bonded to the carrier 20. In other embodiments, the LED dies 110 may be wire-bonded to the carrier 20.

The LED die 110 includes two differently (or oppositely) doped semiconductor layers that are formed, or grown, on a growth substrate. The growth substrate may be sapphire, silicon, silicon carbide, gallium nitride, etc. The growth substrate may already be removed before the LED die 110 is bonded to the carrier 20. The oppositely doped semiconductor layers have different types of conductivity. For example, one of these semiconductor layers contains a material doped with an n-type dopant, while the other one of the two semiconductor layers contains a material doped with a p-type dopant. In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In certain embodiments, the oppositely doped semiconductor layers include a p-doped gallium nitride (p-GaN) material and an n-doped gallium nitride material (n-GaN), respectively. The p-type dopant may include Magnesium (Mg), and the n-type dopant may include Carbon (C) or Silicon (Si).

The LED die 110 includes a light emitting layer such as a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses. In certain alternative embodiments, suitable light-emitting layers other than an MQW layer may be used instead.

The LED die 110 may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by one or more epitaxial growth processes known in the art. For example, these layers may be formed by processes such as metal organic vapor phase epitaxy (MOVPE), molecular-beam epitaxy (MBE), metal organic chemical vapor deposition (MOCVD), hydride vapor phase epitaxy (HVPE), liquid phase epitaxy (LPE), or other suitable processes. These processes may be performed at suitable deposition processing chambers and at high temperatures ranging from a few hundred degrees Celsius to over one thousand degrees Celsius.

The n-doped semiconductor layer, the p-doped semiconductor layer, and the MQW disposed in between collectively constitute a core portion of the LED die 110. When an electrical voltage (or electrical charge) is applied to the doped layers of the LED die 110, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. For example, the LED die herein may be a blue LED emitter, in other words, they are configured to emit blue light. In certain embodiments, a center wavelength (or peak wavelength) of the LED die 110 is tuned to be in a range from about 440 nm to about 465 nm. But in other embodiments, the LED die 110 may be configured to emit light of a different wavelength.

The LED die 110 also includes two conductive terminals, which may include metal pads. Electrical connections to the LED die 110 may be established through the conductive terminals. For example, one of the conductive terminals may be a p-terminal (i.e., electrically coupled to the p-GaN layer of the LED die 110), and the other one of the conductive terminals is an n-terminal (i.e., electrically coupled to the n-GaN layer of the LED die 110). Thus, an electrical voltage can be applied across the terminals to generate a light output from the LED die 110.

The LED die 110 may include a photo-conversion material 150 such as a phosphor film coated around the LED die 110. The photo-conversion material 150 is applied to the LED die before the LED die 110 is bonded to the carrier 20. The phosphor film 150 may include either phosphorescent materials and/or fluorescent materials. The phosphor film 150 is used to transform the color of the light emitted by an LED die. In some embodiments, the phosphor film 150 contains yellow phosphor particles and can transform a blue light emitted by an LED die 110 into a different wavelength light. In other embodiments, a dual phosphor may be used, which may contain yellow powder and red powder phosphor. By changing the material composition of the phosphor film 150, the desired light output color (e.g., a color resembling white) may be achieved. In some embodiments, the phosphor film 150 includes at least two sub-layers (i.e., a composite layer structure). For example, one of these sub-layers may contain a gel mixed with phosphor particles, while the other one of these sub-layers may contain a gel mixed with diffuser particles. As another example, one of these sub-layers may contain yellow phosphor particles mixed with gel, while the other one of these sub-layers may contain red phosphor particles mixed with gel.

The phosphor film 150 may be coated on the surfaces of the LED die 110 in a concentrated viscous fluid medium (e.g., liquid glue or gel). In certain embodiments, the viscous fluid may include silicone epoxy and have a refractive index in a range from about 1.4 to about 2. In some embodiments, diffuser particles may also be mixed in the viscous fluid. The diffuser particles may include, as examples, silica, PMMA, $ZrO_2$, or silicon. In some other embodiments, one layer of the viscous fluid may be mixed with the phosphor particles, while another layer of the viscous fluid may be mixed with the diffuser particles, and then one of the two layers of the viscous fluid is applied over the other. Similarly, in some embodiments, one layer of the viscous fluid may be mixed with yellow phosphor, while the other layer of the viscous fluid may be mixed with red phosphor. The phosphor film 150 is used herein to denote a single layer of phosphor mixed with the gel, or multiple layers of phosphor mixed with the gel. As the viscous liquid sets or cures, the phosphor material becomes a part of the LED package. In some embodiments, a curing temperature in a range between about 130 degrees Celsius to about 170 degrees Celsius is used.

In the embodiment shown in FIG. 4, the LED die 110 is bonded to the carrier 20 through a plurality of solder bumps 160. In this manner, the LED die 110 and the IC device 30 are electrically coupled together through the conductive interconnect elements 25 of the carrier as well as the solder bumps 40 and 160. As such, the electronic circuitry on the IC device 30 can be configured to electrically control the operation of the LED die 110. The LED die 110 is also circumferentially surrounded by the sidewalls of the reflective cap structure 60. The reflective cap structure 60 can thus reflect light emitted by the LED die 110.

Figure 5:
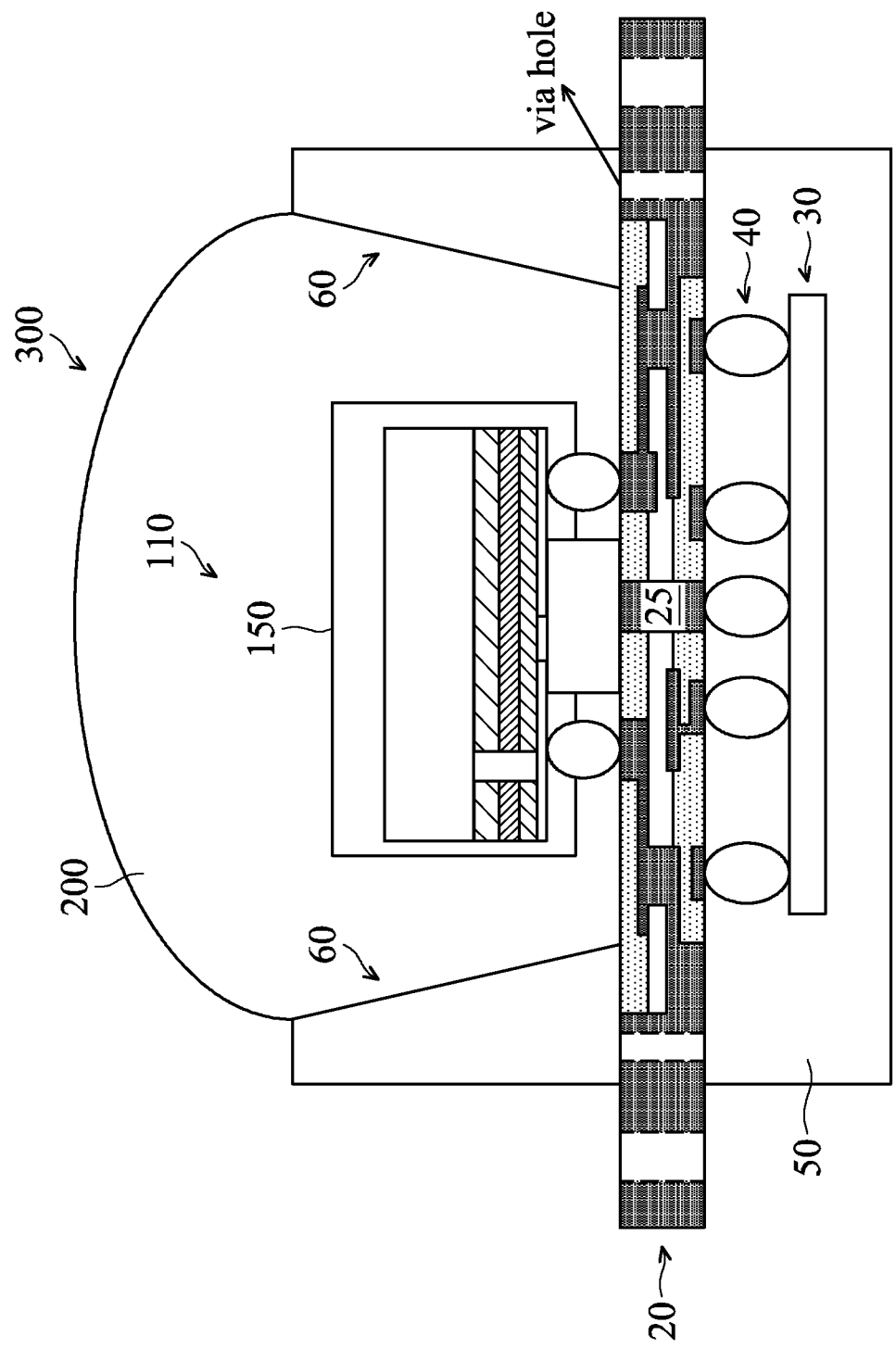
Figure 6:
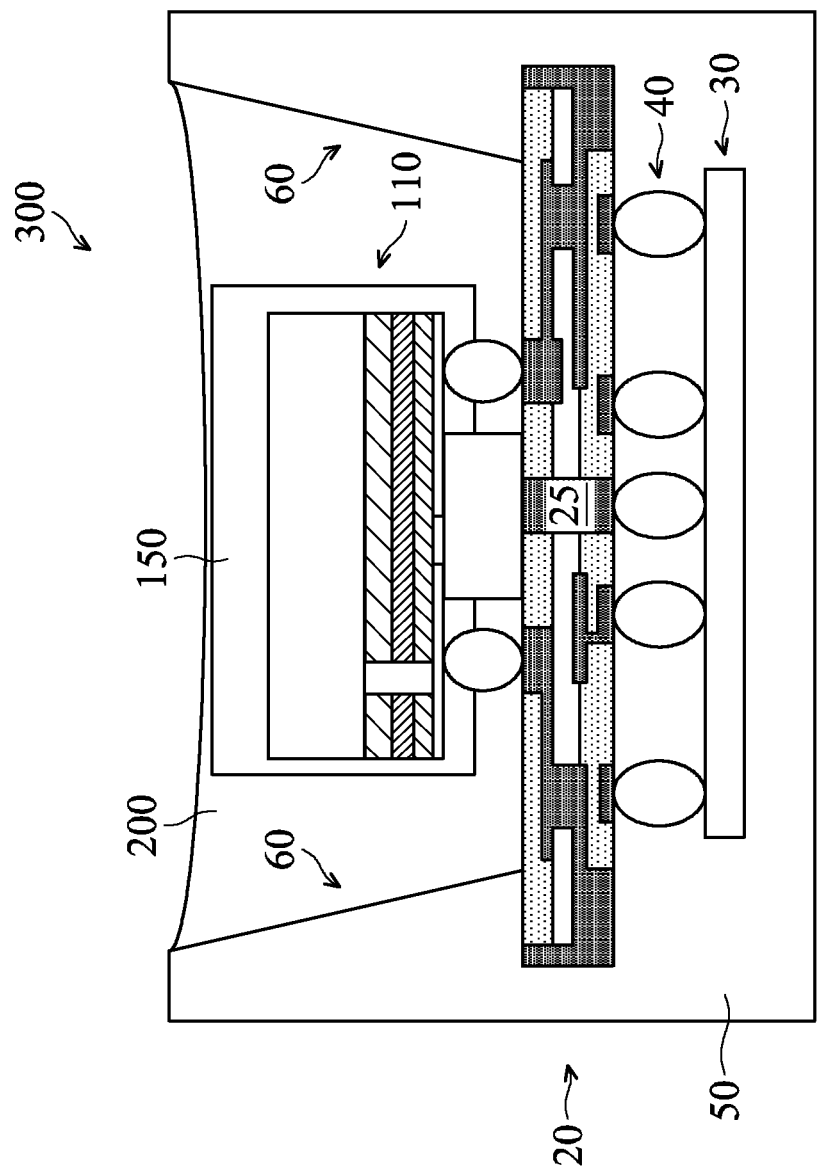

Referring now to FIG. 5, a transparent material 200 is formed over the top side of the carrier 20 and in the reflective cap structure 60. As such, the LED die 110 is packaged by the transparent material 200. The transparent material 200 may include, as examples. Silicone, epoxy, PET, UV, glue, polyimide, or glass. An upper surface of the transparent material 200 is shaped to have a curved cross-sectional profile. In the embodiment shown in FIG. 5, the upper surface of the transparent material 200 is shaped to have a dome-like convex profile, thereby serving as a lens for focusing light. Alternatively, the upper surface of the transparent material 200 may also be shaped to have a concave profile, such as shown in FIG. 6, which also allows it to focus light. The transparent material 200 therefore may also be referred to as a lens for the LED die 110. The different designs of the lens (i.e., the transparent material 200) 200 serve different optical purposes. Regardless of the specific lens design, however, a lighting module 300 is created after the formation of the lens 200, where the LED die 110 and the IC device 30 share the same carrier 20 and the same packaging (i.e., the packaging material 50).

Figure 7:
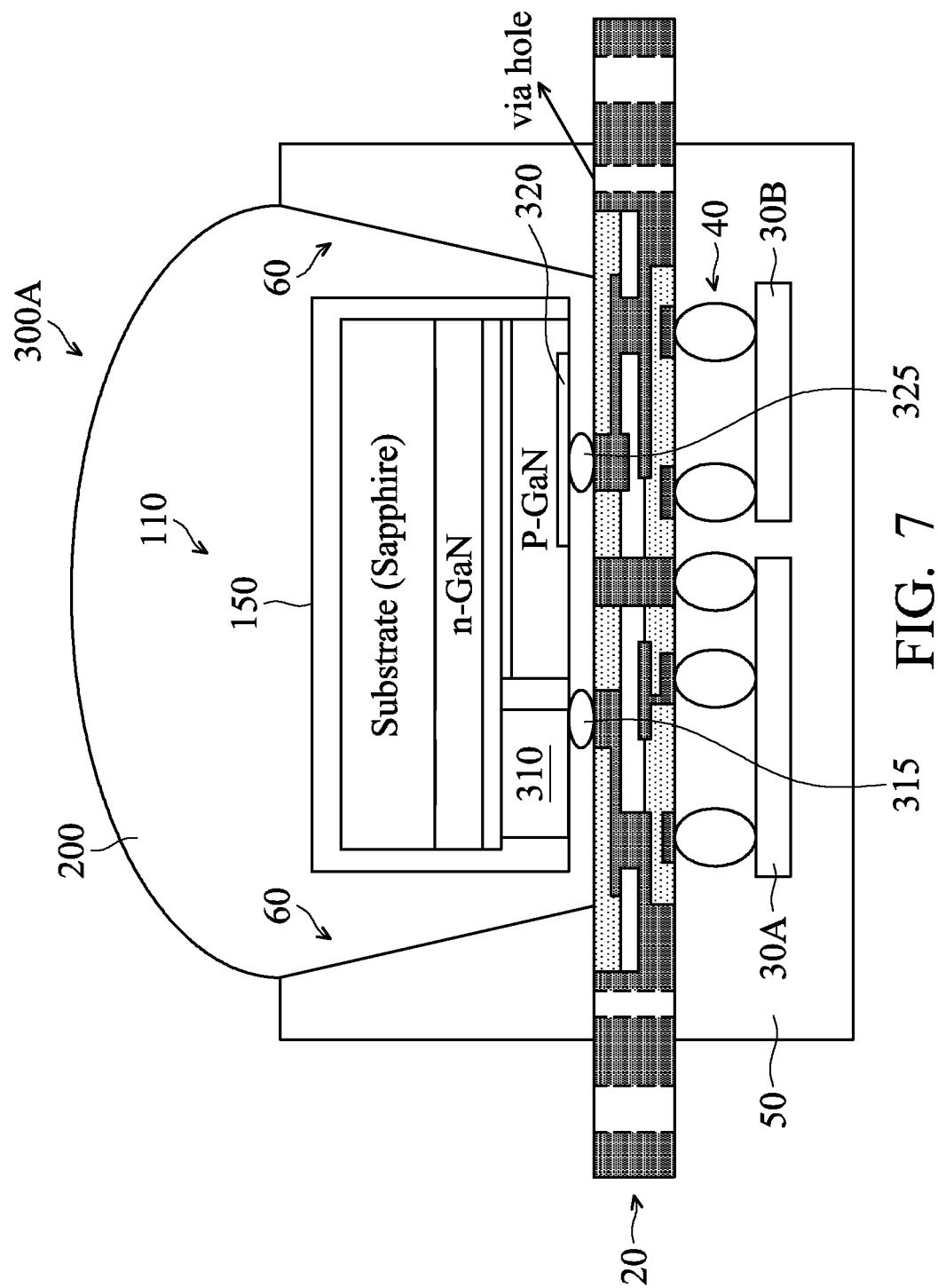

FIG. 7 illustrates an alternative embodiment of the lighting module, labeled as the lighting module 300A. For purposes of consistency and clarity, similar components appearing in FIGS. 1-7 are labeled the same. Referring to FIG. 7, the lighting module 300A includes two separate IC devices 30A and 30B that are bonded to the bottom side of the carrier 20. In some embodiments, the IC device 30A is a power IC, whereas the IC device 30B is a microcontroller IC. The IC device 30A-30B may be other types of ICs in alternative embodiments. In some embodiments, both the IC devices 30A and 30B are unpackaged when they are bonded to the carrier 20.

After the bonding of the IC devices 30A and 30B, the packaging material 50 is applied to the IC devices 30A and 30B as well as the carrier 20. A portion of the packaging material 50 is also molded into the reflective cap structure 60. Thereafter, the LED die 110 is flip-chip bonded to the top side of the carrier 20. For example, the n-type doped semiconductor layer of the LED die 110 (shown as n-GaN in FIG. 7) is bonded to the carrier through a conductive terminal 310 and a solder bump 315 bonded to the carrier 20. Meanwhile, the p-type doped semiconductor layer of the LED die 110 (shown as p-GaN in FIG. 7) is bonded to the carrier 20 through a conductive terminal 320 and a solder bump 325 bonded to the carrier 20. Therefore, the IC devices 30A-30B and the LED die 110 are still electrically coupled together through the solder bumps 40, the conductive interconnect element 25 of the carrier, the conductive terminals 310 and 320, and the solder bumps 315 and 325. The electronic circuitry on the IC devices 30A-30B can then be used to electronically control the operation of the LED die 110.

Figure 8:
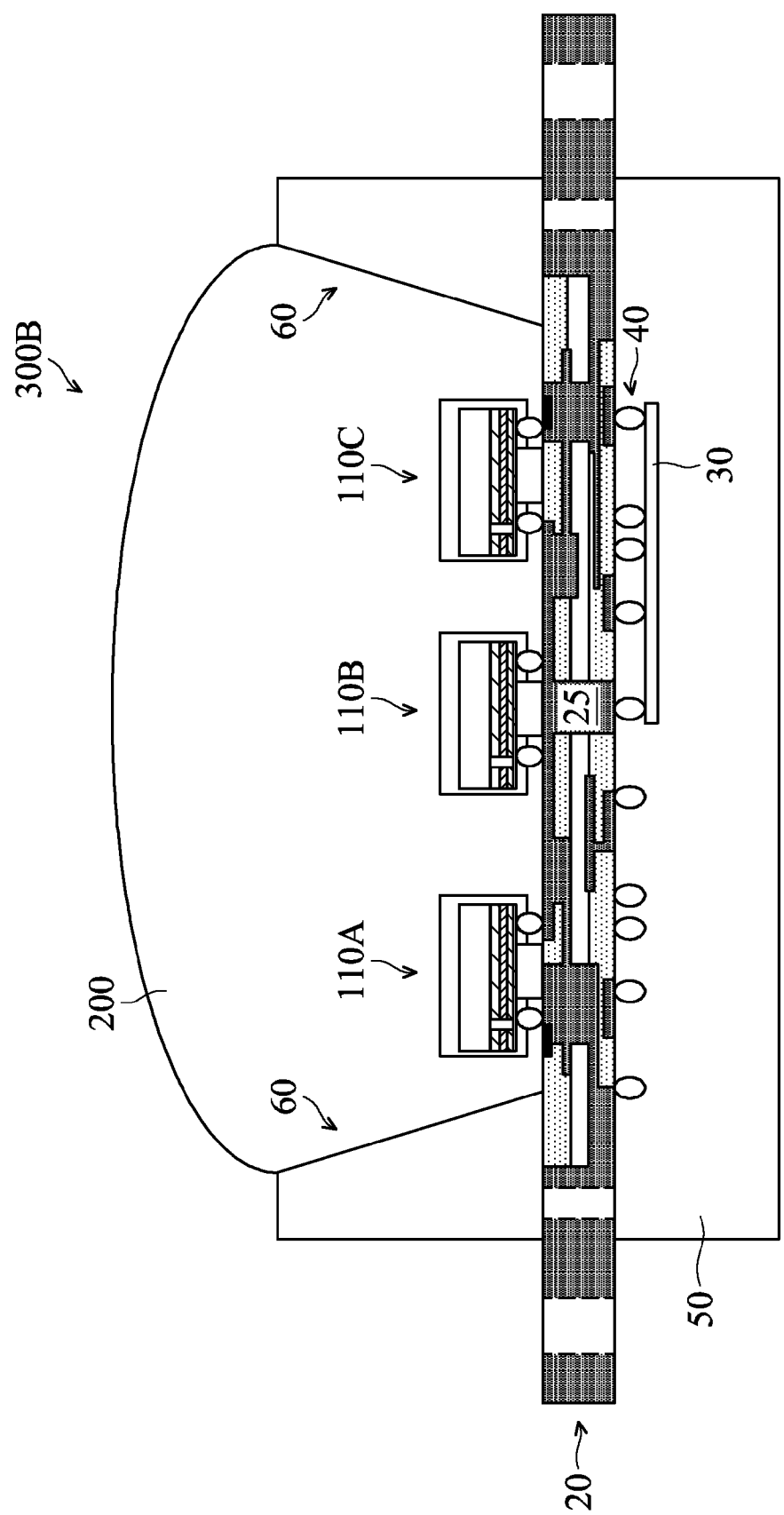
Figure 9:
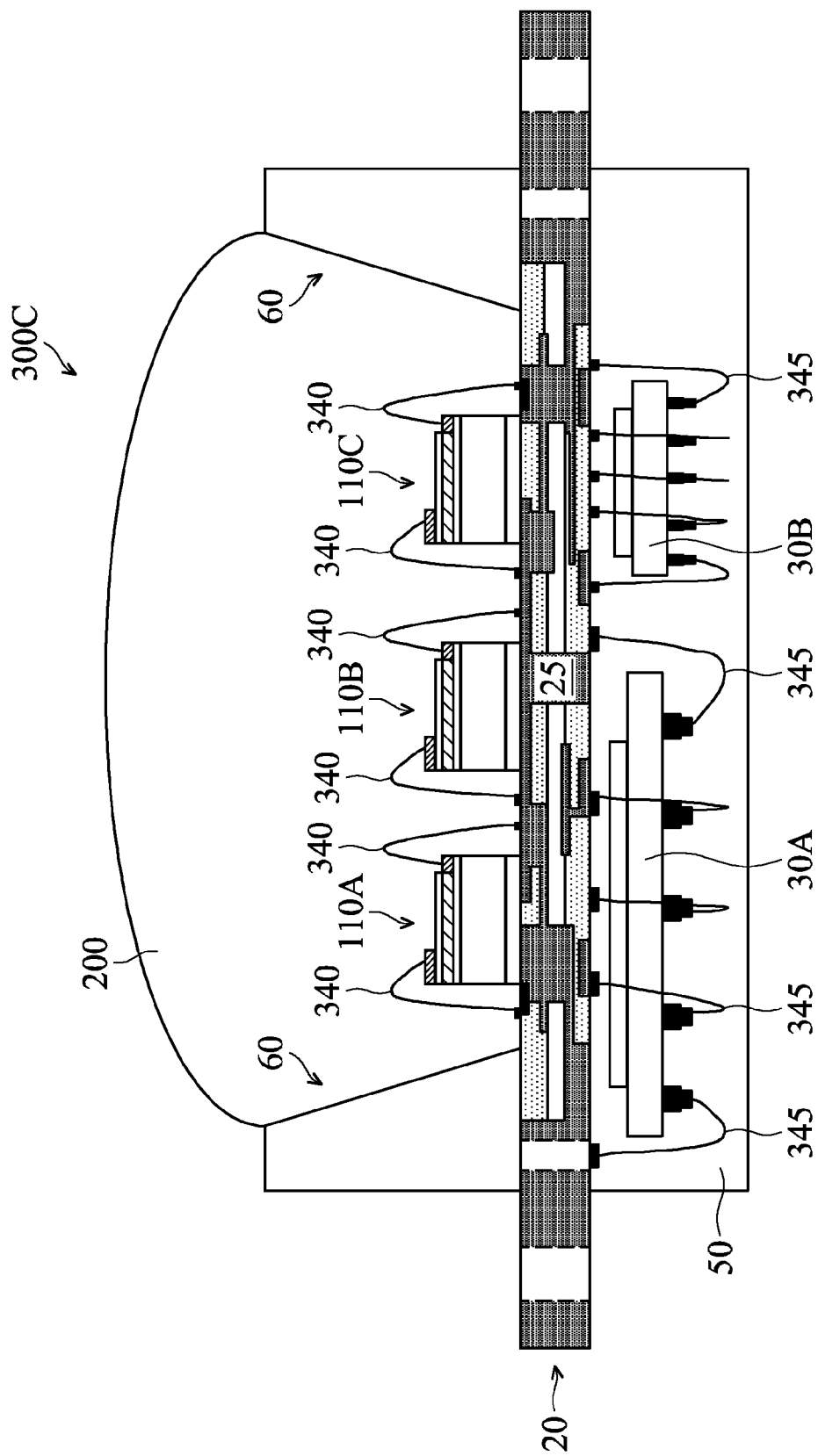
Figure 10:
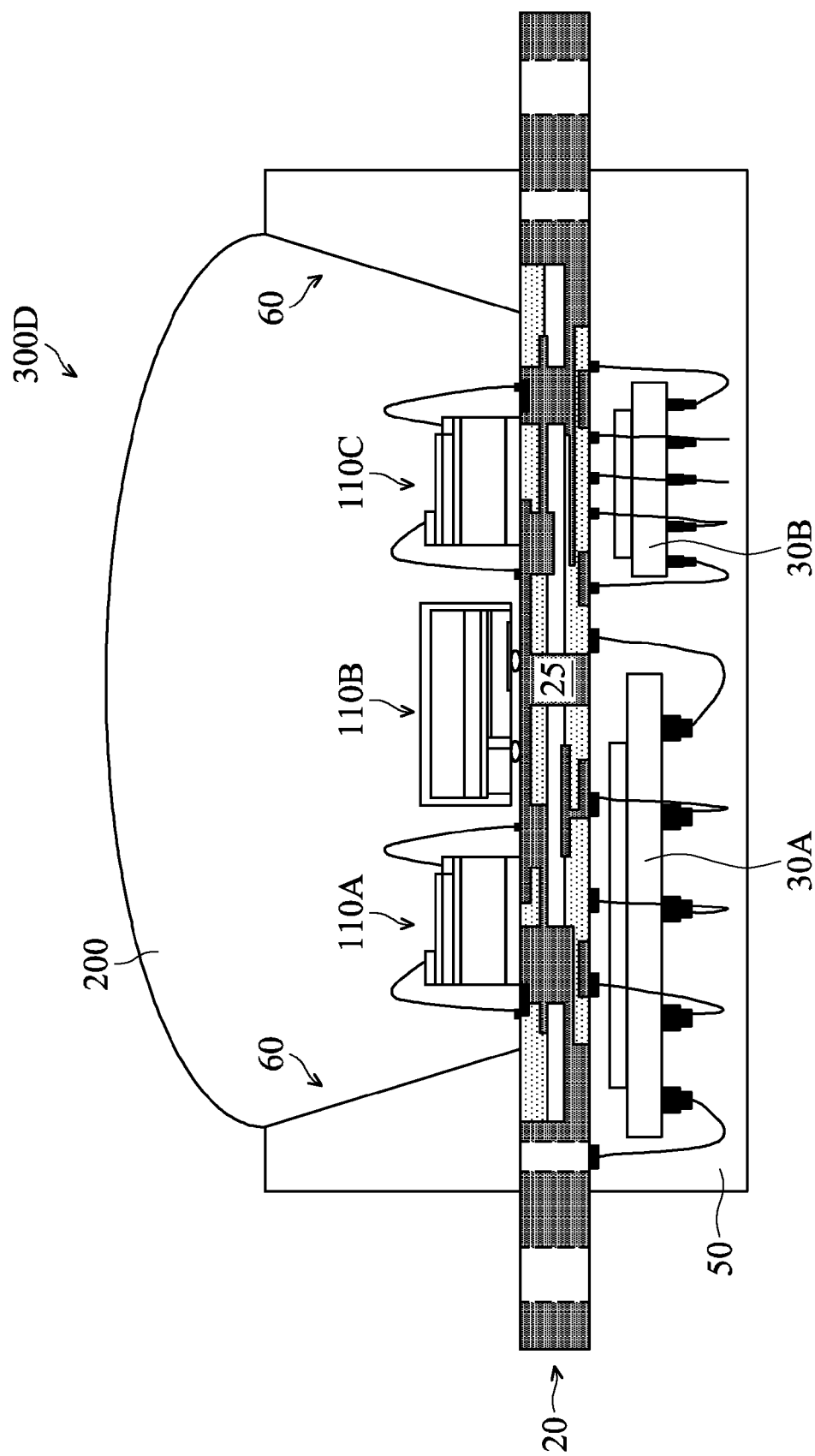

FIGS. 8-10 illustrate other alternative embodiments of the lighting modules, labeled as the lighting modules 300B, 300C, and 300D, respectively. Referring now to FIG. 8, the lighting module 300B includes a plurality of LED dies 110A, 100B, and 100C that are bonded to the top side of the carrier 20. Again, these LED dies 110A-110C are electrically coupled to the IC device 30 through the interconnect elements in the carrier 20 and the respective solder bumps and bonding pads/terminals.

In the embodiments shown in FIGS. 1-8, the LED dies 110 are bonded to the carrier 20 through a flip-chip bonding process. Referring now to the lighting module 300C shown in FIG. 9, the LED dies 110A-110C can also be bonded to the carrier 20 through a wire-bonding process through the use of a plurality of bonding wires 340. In other words, the n-type and p-type semiconductor layers of each of the LED dies 110 are electrically coupled to the carrier 20 through the bonding wires 340. The IC devices 30A and 30B may also be bonded to the carrier 20 through a plurality of bonding wires 345. Again, these LED dies 110A-110C are electrically coupled to the IC devices 30A-30B through the interconnect elements in the carrier 20 and the respective solder bumps and bonding pads/terminals.

It is also understood that not all of the LED dies 110A-110C have to be bonded to the carrier 20 through flip-chip bonding or wire-bonding. Rather, a subset of the LED dies 110A-110C may be flip-chip bonded to the carrier 20 while another subset of the LED dies 110A-110C may be wire-bonded to the carrier 20. An example of such embodiment is illustrated in FIG. 10, which shows a lighting module 300D that has LED dies 110A and 110C wire-bonded to the carrier 20, and the LED 110B flip-chip bonded to the carrier 20. Again, these LED dies 110A-110C are electrically coupled to the IC devices 30A-30B through the interconnect elements in the carrier 20 and the respective solder bumps and bonding pads/terminals.

Although not specifically illustrated, it is understood that additional configurations are possible, for example one of the IC devices 30 may be bonded to the carrier 20 through solder bumps, while another of the IC devices 30 may be wire-bonded to the carrier 20.

Figure 11B:
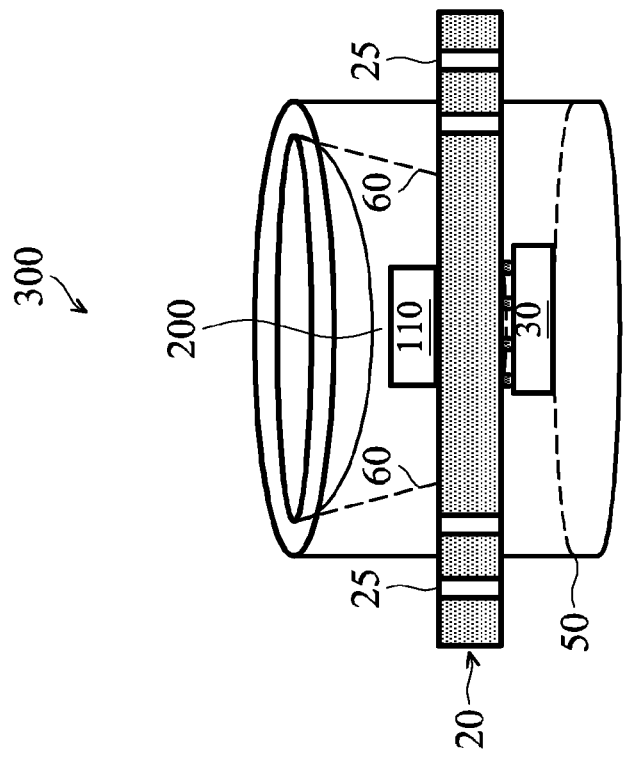
FIGS. 11A and 11B are each a diagrammatic perspective view of an embodiment of a lighting module according to various aspects of the present disclosure.
Figure 11A:
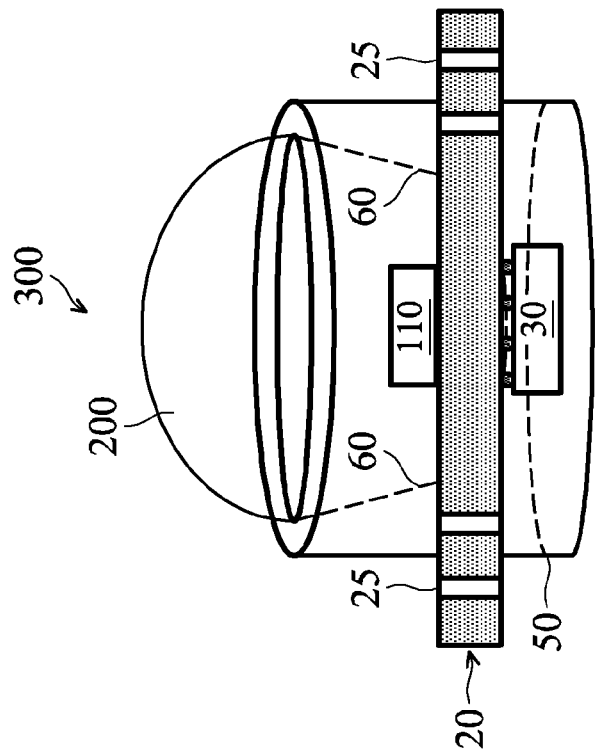

FIGS. 11A and 11B each illustrate a simplified diagrammatic perspective view of an embodiment of the lighting module 300 discussed above. Referring to FIG. 11A, the lighting module 300 has a transparent material 200 that is shaped to have a convex profile. In comparison, the lighting module 300 shown in FIG. 11B has a transparent material 200 that is shaped to have a concave profile. The transparent material 200 serves as a lens for both embodiments of the lighting module 300 shown in FIGS. 11A-11B. Again, the different designs of the lens 200 serve different optical purposes. Regardless of the specific lens design, however, the LED die 110 and the IC device 30 share the same carrier 20 and the same packaging (i.e., the packaging material 50).

Figure 12:
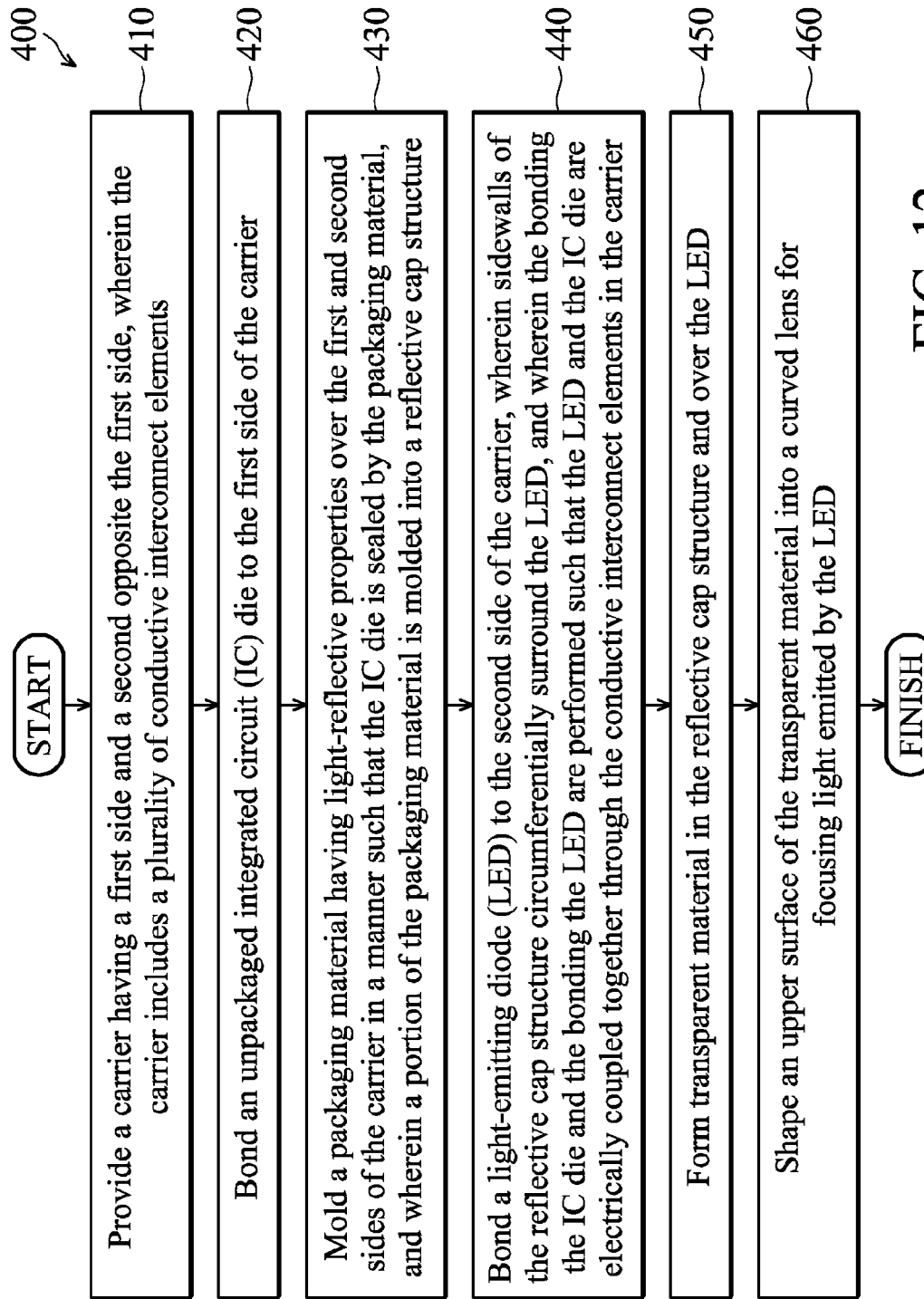
FIG. 12 is a flowchart illustrating a method of packaging an LED according to various aspects of the present disclosure.

FIG. 12 is a flowchart of a method 400 for packaging an LED according to various aspects of the present disclosure. The method 400 includes a step 410, in which a carrier is provided. The carrier has a first side and a second opposite the first side. The carrier includes a plurality of conductive interconnect elements. The method 400 includes a step 420, in which an integrated circuit (IC) die is bonded to the first side of the carrier. In some embodiments, the IC die may be an unpackaged IC die. In other embodiments, the IC die may be a packaged IC die. The method 400 includes a step 430, in which a packaging material is molded over the first and second sides of the carrier in a manner such that the IC die is sealed by the packaging material. In some embodiments, the packaging material has light-reflective properties. A portion of the packaging material is molded into a reflective cap structure. The method 400 includes a step 440, in which a light-emitting diode (LED) is bonded to the second side of the carrier. Sidewalls of the reflective cap structure circumferentially surround the LED. The bonding of the IC die and the bonding of the LED are performed such that the LED and the IC die are electrically coupled together through the conductive interconnect elements in the carrier. In some embodiments, the LED die is flip-chip bonded to the carrier. In other embodiments, the LED die is wire-bonded to the carrier. The method 400 includes a step 450, in which transparent material is formed in the reflective cap structure and over the LED. The method 400 includes a step 460, in which an upper surface of the transparent material is shaped into a curved lens for focusing light emitted by the LED.

In some embodiments, the IC die includes electronic circuitry configured to control operations of the LED. In some embodiments. In some embodiments, the LED is phosphor-coated before being bonded to the second side of the carrier. In some embodiments, more than one LED die is bonded to the carrier. In certain embodiments where multiple LED dies are bonded to the carrier, some of the LED dies may be flip-chip bonded to the carrier, while other LED dies may be wire-bonded to the carrier.

Additional processes may be performed before, during, or after the blocks 410-460 discussed herein to complete the fabrication of the lighting apparatus. For reasons of simplicity, other additional processes are not discussed herein.

The present disclosure offers advantages over existing methods and systems of LED packaging. It is understood, however, that different embodiments offer different advantages, not all advantages are necessarily discussed herein, and that no particular advantage is required for any embodiment. One advantage is that, since the LED dies and the IC devices are packaged together, packaging process time is reduced. As another example, the light source module will be more integrated due to the LED dies and the IC devices being packaged together. As yet another advantage, the collective packaging of the LED dies and the IC devices leads to a more compact size of the lighting module.

Figure 13:
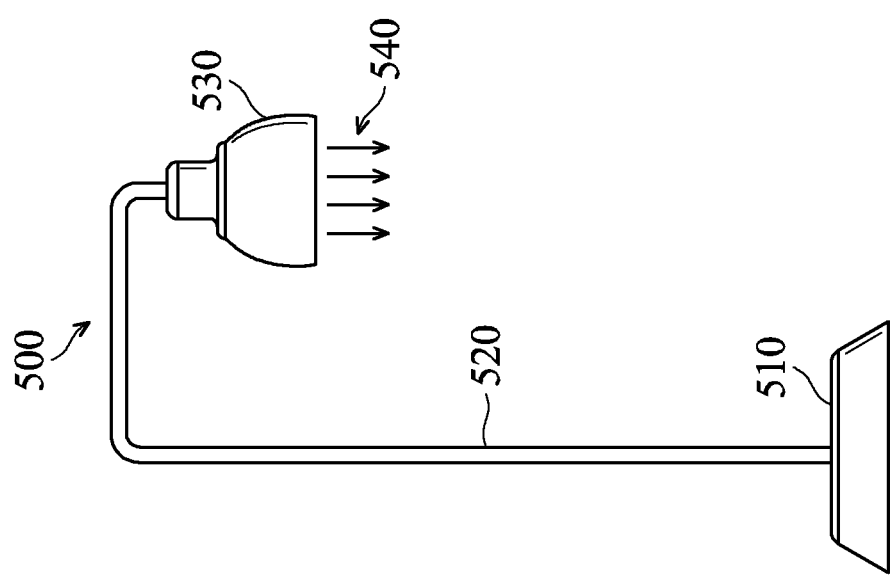
FIG. 13 is a diagrammatic view of a lighting system according to various aspects of the present disclosure.

FIG. 13 illustrates a simplified diagrammatic view of a lighting system 500 that includes the lighting module 300 discussed above. The lighting system 500 has a base 510, a body 520 attached to the base 510, and a lighting assembly 530 attached to the body 520. In some embodiments, the lighting assembly 530 is a down lamp (or a down light lighting module). In other embodiments, the lighting assembly 530 may be another type of light, such as a par light or a light tube. The lighting assembly 530 may be used for in-door lighting or out-door lighting, such as a street lamp or road lamp.

The lighting assembly 530 can include the lighting unit (e.g. lighting module 300). In other words, the lighting assembly 530 of the lighting system 500 includes an LED-based light source, wherein the LED die and the IC device controlling the LED die are bonded to the same carrier. The LED packaging for the lighting assembly 530 is configured to produce a light output 540. It is also understood that in certain embodiments, light modules not using an optical gel or a diffuser cap may also serve as a light source (e.g., the lighting assembly 530) for the lighting system 500.

It is understood that other lighting applications may benefit from using the LEDs of the present disclosure discussed above. For example, the LEDs of the present disclosure may be used in lighting applications including, but not limited to, vehicle headlights or taillights, vehicle instrument panel displays, light sources of projectors, light sources of electronics such as Liquid Crystal Display (LCD) televisions or LCD monitors, tablet computers, mobile telephones, or notebook/laptop computers.

The present disclosure involves a method of packaging. The method includes: providing a substrate, the substrate having a first side and a second opposite the first side; bonding an integrated circuit (IC) die to the first side of the substrate; applying a packaging material over the first and second sides of the substrate through a molding process, wherein the IC die is enclosed by the packaging material, and wherein a portion of the packaging material is molded into a concave structure over the second side of the substrate; bonding a light-emitting diode (LED) to the second side of the substrate, wherein the LED is circumferentially surrounded by sidewalls of the concave structure; and forming a lens over the second side of the substrate, wherein the LED is disposed below the lens.

In some embodiments, the IC die includes electronic circuitry configured to control operations of the LED.

In some embodiments, the sidewalls of the concave structure are configured to reflect light emitted by the LED.

In some embodiments, the LED is phosphor-coated before being bonded to the second side of the substrate.

In some embodiments, the bonding the LED comprises flip-chip bonding or wire-bonding the LED to the second side of the substrate. In some embodiments, the method further includes: before the forming the lens, bonding a further LED to the second side of the substrate, wherein the further LED is also circumferentially surrounded by sidewalls of the concave structure. In some embodiments, the LED and the further LED are bonded differently to the second side of the substrate.

In some embodiments, the forming the lens comprises: forming a transparent material in the concave structure and over the LED die; and shaping an upper surface of the transparent material to have a concave or convex cross-sectional profile.

In some embodiments, the substrate includes a plurality of conductive interconnect elements, and wherein the bonding the IC and the bonding the LED are performed such that the IC die and the LED are electrically coupled together through the interconnect elements.

The present disclosure also involves a method of packaging. The method includes: providing a carrier having a first side and a second opposite the first side, wherein the carrier includes a plurality of conductive interconnect elements; bonding an integrated circuit (IC) die to the first side of the carrier; molding a packaging material having light-reflective properties over the first and second sides of the carrier in a manner such that the IC die is sealed by the packaging material, and wherein a portion of the packaging material is molded into a reflective cap structure; bonding a light-emitting diode (LED) to the second side of the carrier, wherein sidewalls of the reflective cap structure circumferentially surround the LED, and wherein the bonding the IC die and the bonding the LED are performed such that the LED and the IC die are electrically coupled together through the conductive interconnect elements in the carrier; forming transparent material in the reflective cap structure and over the LED; and shaping an upper surface of the transparent material into a curved lens for focusing light emitted by the LED.

In some embodiments, the IC die includes electronic circuitry configured to control operations of the LED.

In some embodiments, the bonding the LED comprises flip-chip bonding or wire-bonding the LED to the second side of the carrier.

In some embodiments, the LED is phosphor-coated before being bonded to the second side of the carrier.

The present disclosure further involves a packaging structure. The packaging structure includes: a carrier having a first side and a second opposite the first side; an integrated circuit (IC) die bonded to the first side of the carrier; a light-emitting diode (LED) bonded to the second side of the carrier; a packaging material molded over the first and second sides of the carrier and over the IC die, wherein the IC die is sealed by the packaging material, and wherein a portion of the packaging material is molded into a recessed structure over the second side of the carrier, the recessed structure having sidewalls circumferentially surrounding the LED; and a lens disposed above the LED over the second side of the carrier.

In some embodiments, the IC die includes electronic circuitry configured to control operations of the LED.

In some embodiments, the packaging material is light-reflective, and wherein the sidewalls of the recessed structure are configured to reflect light emitted by the LED.

In some embodiments, the LED includes a phosphor coating.

In some embodiments, the LED is flip-chip bonded to the second side of the carrier, and wherein the packaging structure further comprises a further LED that is wire-bonded to the second side of the carrier, the further LED being disposed under the lens.

In some embodiments, the lens comprises a transparent material disposed in the recessed structure, and wherein an upper surface of the transparent material has a concave or convex cross-sectional profile.

In some embodiments, the carrier includes a plurality of conductive interconnect elements, and wherein the IC die and the LED are electrically coupled together through the conductive interconnect elements.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method of packaging, comprising:
providing a substrate, the substrate having a first side and a second side opposite the first side wherein the substrate is a metal core printed circuit board (MCPCB), wherein the MCPCB contains: a metal base, a thermally conductive but electrically insulating dielectric layer disposed on the metal base, and a metal layer disposed on the thermally conductive but electrically insulating dielectric layer;

bonding an integrated circuit (IC) die to the first side of the substrate, wherein the IC die includes at least one of: a wireless data control IC, a network data control IC, a power converter IC, a linear regulator IC, or rectifiers;

applying a packaging material over the first and second sides of the substrate through a molding process, wherein the IC die is enclosed by the packaging material, and wherein a portion of the packaging material is molded into a concave structure over the second side of the substrate;

bonding a light-emitting diode (LED) to the second side of the substrate, wherein the LED is circumferentially surrounded by sidewalls of the concave structure; and forming a lens over the second side of the substrate, wherein the LED is disposed below the lens.

2. The method of claim 1, wherein the IC die includes electronic circuitry configured to control operations of the LED.

3. The method of claim 1, wherein the sidewalls of the concave structure are configured to reflect light emitted by the LED.

4. The method of claim 1, wherein the LED is phosphor-coated before being bonded to the second side of the substrate.

5. The method of claim 1, wherein the bonding the LED comprises flip-chip bonding or wire-bonding the LED to the second side of the substrate.

6. The method of claim 5, further comprising: before the forming the lens, bonding a further LED to the second side of the substrate, wherein the further LED is also circumferentially surrounded by sidewalls of the concave structure.

7. The method of claim 6, wherein the LED and the further LED are bonded differently to the second side of the substrate.

8. The method of claim 1, wherein the forming the lens comprises:
    forming a transparent material in the concave structure and over the LED die; and
    shaping an upper surface of the transparent material to have a concave or convex cross-sectional profile.

9. The method of claim 1, wherein the substrate includes a plurality of conductive interconnect elements, and wherein the bonding the IC and the bonding the LED are performed such that the IC die and the LED are electrically coupled together through the interconnect elements.

10. A method of packaging, comprising:
    providing a carrier having a first side and a second opposite the first side, wherein the carrier is a metal core printed circuit board (MCPCB), wherein the MCPCB contains: a metal base, a thermally conductive but electrically insulating dielectric layer disposed on the metal base, and a plurality of conductive interconnect elements;
    bonding, through one or more solder bumps, an integrated circuit (IC) die to the first side of the carrier, wherein the IC die includes one of: a wireless data control IC, a network data control IC, a power converter IC, a linear regulator IC, or rectifiers;
    molding a packaging material having light-reflective properties over the first and second sides of the carrier in a manner such that the IC die is sealed by the packaging material, and wherein a portion of the packaging material is molded into a reflective cap structure;
    bonding a light-emitting diode (LED) to the second side of the carrier, wherein sidewalls of the reflective cap structure circumferentially surround the LED, and wherein the bonding the IC die and the bonding the LED are performed such that the LED and the IC die are electrically coupled together through the plurality of conductive interconnect elements in the carrier;
    forming transparent material in the reflective cap structure and over the LED; and
    shaping an upper surface of the transparent material into a curved lens for focusing light emitted by the LED.

11. The method of claim 10, wherein the IC die includes electronic circuitry configured to control operations of the LED.

12. The method of claim 10, wherein the bonding the LED comprises flip-chip bonding or wire-bonding the LED to the second side of the carrier.

13. The method of claim 10, wherein the LED is phosphor-coated before being bonded to the second side of the carrier.

14. A method of packaging, comprising:
    providing a substrate, the substrate having a first side and a second side opposite the first side wherein the substrate is a metal core printed circuit board (MCPCB), wherein the MCPCB contains: a metal base, a thermally conductive but electrically insulating dielectric layer disposed on the metal base, and a metal layer disposed on the thermally conductive but electrically insulating dielectric layer;
    attaching an integrated circuit (IC) die to the first side of the substrate, wherein the IC die includes at least one of: a wireless data control IC, a network data control IC, a power converter IC, a linear regulator IC, or rectifiers;
    applying a packaging material over the first and second sides of the substrate through a molding process, wherein the IC die is enclosed by the packaging material, and wherein a portion of the packaging material is molded into a concave structure over the second side of the substrate, the concave structure having light-reflective sidewalls;
    attaching a light-emitting diode (LED) to the second side of the substrate in a manner such that the LED is encircled by the light-reflective sidewalls of the concave structure, and
    wherein operations of the LED are controlled by the IC die; and forming a lens over the second side of the substrate, wherein the LED is disposed below the lens.

15. The method of claim 14, further comprising: phosphor coating the LED before the attaching of the LED to the second side of the substrate.

16. The method of claim 14, wherein the attaching of the LED comprises flip-chip bonding the LED to the second side of the substrate.

17. The method of claim 14, wherein the attaching of the LED comprises wire-bonding bonding the LED to the second side of the substrate.

18. The method of claim 14, wherein the attaching of the LED comprises attaching a plurality of further LEDs to the second side of the substrate, wherein the plurality of further LEDs are also encircled by the light-reflective sidewalls of the concave structure.

19. The method of claim 14, wherein the forming the lens comprises:
    forming a transparent material in the concave structure and over the LED die; and
    shaping an upper surface of the transparent material to have a concave or convex cross-sectional profile.

20. The method of claim 14, wherein the substrate includes a plurality of conductive interconnect elements, and wherein the attaching of the IC and the attaching of the LED are performed such that the IC die and the LED are electrically coupled together through the interconnect elements.

* * * * *